(12) United States Patent
Cai et al.

(10) Patent No.: US 11,839,034 B2
(45) Date of Patent: Dec. 5, 2023

(54) FLEXIBLE PANEL AND DISPLAY DEVICE

(71) Applicant: BOE Technology Group Co., Ltd., Beijing (CN)

(72) Inventors: Peng Cai, Beijing (CN); Youwei Wang, Beijing (CN); Yongxiang Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 622 days.

(21) Appl. No.: 17/054,417

(22) PCT Filed: Mar. 24, 2020

(86) PCT No.: PCT/CN2020/080863
§ 371 (c)(1),
(2) Date: Nov. 10, 2020

(87) PCT Pub. No.: WO2020/238361
PCT Pub. Date: Dec. 3, 2020

(65) Prior Publication Data
US 2021/0274659 A1    Sep. 2, 2021

(30) Foreign Application Priority Data

May 30, 2019 (CN) .......................... 201910463514.3

(51) Int. Cl.
*H05K 5/00* (2006.01)
*H10K 50/86* (2023.01)
(Continued)

(52) U.S. Cl.
CPC ......... *H05K 5/0017* (2013.01); *H10K 50/844* (2023.02); *H10K 50/86* (2023.02);
(Continued)

(58) Field of Classification Search
CPC ....................................................... H05K 5/00
See application file for complete search history.

(56) References Cited

U.S. PATENT DOCUMENTS

2014/0307395 A1   10/2014  An
2018/0224894 A1*   8/2018  Namkung ............. G06F 1/1652
2019/0132987 A1*   5/2019  Koo ........................ H05K 7/18

FOREIGN PATENT DOCUMENTS

CN   109003998 A   12/2018
CN   109494237 A   3/2019
(Continued)

*Primary Examiner* — Jerry Wu
(74) *Attorney, Agent, or Firm* — Westman, Champlin & Koehler, P.A.

(57) ABSTRACT

Embodiments of the present disclosure provide a flexible panel and a display device. In one embodiment, the flexible panel is divided into a folding region and a non-folding region outside the folding region in a first direction, the flexible panel comprises a flexible display module, a first protecting layer and a supporting plate stacked in sequence; the supporting plate is divided into a first supporting portion and an other supporting portion except the first supporting portion, the first supporting portion is located in the folding region and is close to an outer edge of the flexible panel, a width of the first supporting portion is less than a width of the other supporting portion.

6 Claims, 6 Drawing Sheets

(51) Int. Cl.
  *H10K 50/844* (2023.01)
  *H10K 59/12* (2023.01)
  *H10K 59/40* (2023.01)
  *H10K 77/10* (2023.01)
  *H10K 102/00* (2023.01)

(52) U.S. Cl.
  CPC ............ *H10K 59/12* (2023.02); *H10K 59/40* (2023.02); *H10K 77/111* (2023.02); *H10K 2102/311* (2023.02)

(56) References Cited

FOREIGN PATENT DOCUMENTS

| | | |
|---|---|---|
| CN | 110137377 A | 8/2019 |
| CN | 110504295 A | 11/2019 |
| CN | 110707125 A | 1/2020 |

* cited by examiner

FLEXIBLE PANEL AND DISPLAY DEVICE

CROSS-REFERENCE TO RELATED APPLICATION

The present disclosure is a Section 371 National Stage Application of International Application No. PCT/CN2020/080863, filed on Mar. 24, 2020, which claims the benefit of Chinese Patent Application No. 201910463514.3 filed on May 30, 2019 in the China National Intellectual Property Administration, the present disclosure of which is incorporated herein by reference in entirety.

TECHNICAL FIELD

The present disclosure relates to the field of display technologies, in particular, to a flexible panel module and a display device.

BACKGROUND

A flexible display device is a display device formed basing on flexible base materials. Since the flexible device has characteristics of rollability, wide viewing angle, portability, etc., the flexible device has a broad application prospect and a good market potential in a variety of fields involving display devices.

In the related art, in order to avoid creases of a flexible display device caused by repeated folding, a supporting plate is generally attached under the protecting layer of the flexible panel, the supporting plate has a relatively large elastic modulus, with a good restorability, and it is capable of reducing the risk of creases in the flexible display device significantly. However, after the supporting plate is added, the risk of damages to the encapsulating layer and the protecting layer in the flexible panel is increased, the display device may be damaged only after few times of folding, which would shorten the service life of the display device.

SUMMARY

In one aspect, embodiments of the present disclosure provide a flexible panel, the flexible panel is divided into a folding region and a non-folding region outside the folding region in a first direction, the flexible panel comprises a flexible display module, a first protecting layer and a supporting plate stacked in sequence; the supporting plate is divided into a first supporting portion and another supporting portion except the first supporting portion, the first supporting portion is located in the folding region and is close to an outer edge of the flexible panel, a width of the first supporting portion is less than a width of the other supporting portion.

In some embodiments, the supporting plate comprises two first side surfaces parallel to the first direction, in a portion of the support plate located in the folding region, regions close to the two first side surfaces are provided with at least one recess, respectively; the first supporting portion is a portion of the supporting plate facing the recess in a thickness direction.

In some embodiments, a width of the first supporting portion is ⅓ to ½ of the width of the other supporting portion; the recess is disposed on a top surface of the supporting plate close to the flexible display module; or the recess is disposed on a bottom surface of the supporting plate away from the flexible display module.

In some embodiments, the recess comprises a first recess, the first recess is provided with a first opening and a second opening; the first opening is provided on the top surface or the bottom surface of the supporting plate, the second opening is provided on the first side surface of the supporting plate.

In some embodiments, the first recess comprises a first recess bottom surface facing the first opening, and a second recess bottom surface facing the second opening; both the first recess bottom surface and the second recess bottom surface are planar surfaces; or the first recess bottom surface is a planar surface, and the second recess bottom surface is an arc-shaped surface.

In some embodiments, the recess comprises a second recess, the second recess is provided with a first opening, the first opening is provided on the top surface or the bottom surface of the supporting plate; the second recess comprises a second recess bottom surface facing the first opening, the second recess bottom surface is an arc-shaped surface or a planar surface.

In some embodiments, a plurality of second recesses are provided in a region of the first supporting plate close to the first side surface, the plurality of second recesses are arranged at intervals in a direction perpendicular to the first side surface.

In some embodiments, the flexible display module comprises a display functional layer and an encapsulating layer, the encapsulating layer and the supporting plate are respectively disposed on both sides of the display functional layer, the encapsulating layer comprises a first inorganic encapsulating film, an organic encapsulating film and a second inorganic encapsulating film which are stacked in sequence in a direction away from the display functional layer; the recess at least extends beyond the organic encapsulating film in a direction perpendicular to the first side surface.

In some embodiments, the flexible panel further comprises: a polarizer layer, a touching functional layer and a second protecting layer; the first protecting layer is located between the flexible display module and the supporting plate; the polarizer layer, the touching functional layer and the second protecting layer are located on a side of the flexible display module away from the supporting plate; the polarizer layer, the touching functional layer and the second protecting layer are stacked in sequence in the direction away from the display functional layer.

In another aspect, the embodiments of the present disclosure provide a display device, comprising: the flexible panel according to any one of the above embodiments.

Additional aspects and advantages of the present disclosure will be given in the following, these will become apparent from the description below or may be known from the practice of the present disclosure.

BRIEF DESCRIPTION OF THE DRAWINGS

The aforementioned and/or additional aspects and advantages of the present disclosure would become apparent and easy to understand from the following description to the embodiments in conjunction with the accompanying the drawings, wherein.

DETAILED DESCRIPTION OF EMBODIMENTS

Figure 1:
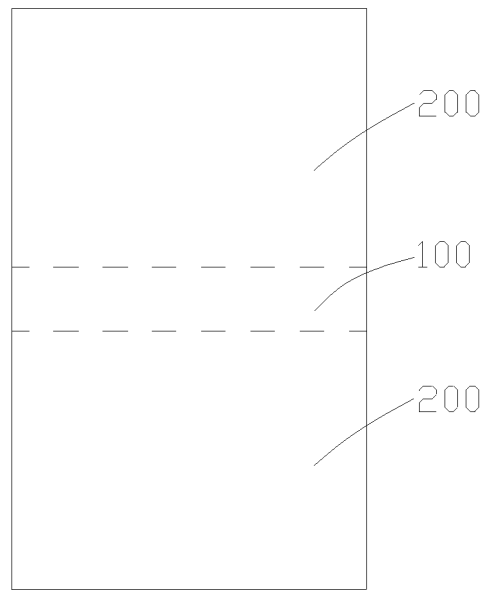
FIGS. 1 to 3 are three dividing manners of the folding region and the non-folding region of the flexible panel according to the embodiments of the present disclosure.

The present disclosure will be described in detail in the following, examples of embodiments of the present disclosure are shown in the drawings, wherein throughout the text, the same or similar numerals indicate the same or similar elements or elements with the same or like functions. In addition, if a detailed description of the known art is unnecessary for illustrated features of the present disclosure, it will be omitted. The embodiments described below with reference to the drawings are exemplary, and are only used for explanation of the present disclosure, and cannot be construed as a limitation to the present disclosure.

It would be understood by those skilled in the art that, unless otherwise defined, all the terms (including technical terms and scientific terms) used herein have the same meaning as general understanding of those skilled in the art. It should further be understood that, terms such as those defined in general dictionaries should be understood to have a meaning consistent with the meaning in the context of the prior art, and unless particularly defined as here, it would not be interpreted in an idealized or overly formal meaning.

Those skilled in the art would understand that, unless particularly stated, singular forms "a", "one", "said", "the" used herein may also comprise plural forms. It should be further understood that, the term "comprise/comprising" used in the specification of the present disclosure indicates the presence of the features, integers, steps, operations, elements, components and/or their combinations, but the presence or the addition of one or more other features, integers, steps, operations, elements, components and/or their combinations is not excluded. In addition, "connected/connecting" or "coupled/coupling" used herein may comprise a wireless connection or a wireless coupling. Term "and/or" used herein comprises all the units or any one of the units and all the combinations of one or more related listed items.

In materials science, when a material is bent, an outer layer of which is stretched, and an inner layer is squeezed, there must be a transition layer on its cross section that is neither stretched nor squeezed, the stress is almost equal to zero, the transition layer is referred to as a neutral layer of the material. The closer a portion of the material is to the neutral layer, the less the tensile force (or squeezing force) received is during the bent, and the less likely the structure is to break.

For a display device, it is also provided with a neutral layer. The inventor of the present disclosure finds that, for a display device without a supporting plate, the encapsulating layer and the protecting layer in the flexible panel are close to the neutral layer, when the display device is bent, the encapsulating layer and the protecting layer receive a relatively small force; after a supporting plate is added to the display device, as the elastic modulus of the supporting plate is larger, the neutral layer in the display device may shift away from the encapsulating layer and the protecting layer, in this case, when the display device is bent, the encapsulating layer and the protecting layer may receive a relatively large force, which would significantly increase the risk of damage to the encapsulating layer and the protecting layer, the display device may be destroyed after few times of folding, and the service life of the display device is shortened.

The inventor of the present disclosure further finds that, a position where the encapsulating layer and the protecting layer are damaged is generally located in the folding region and is biased toward an edge of the panel, which indicates that the region receives a larger force during being bent, thus it is prone to damage.

Figure 2:
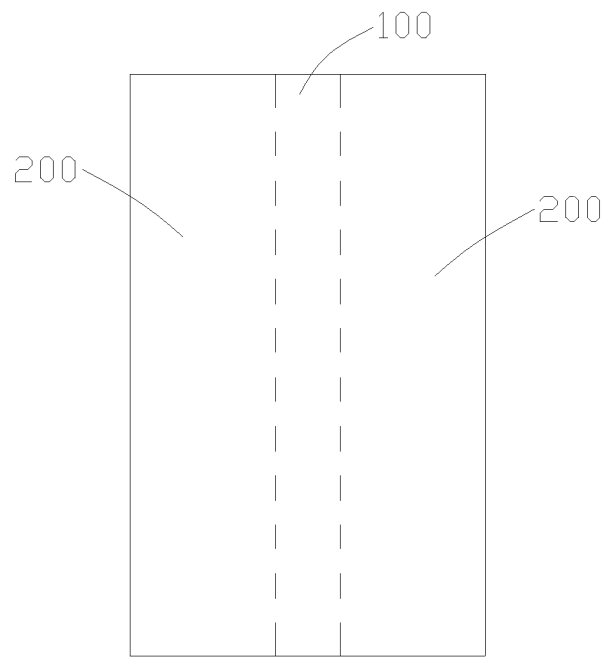
Figure 3:
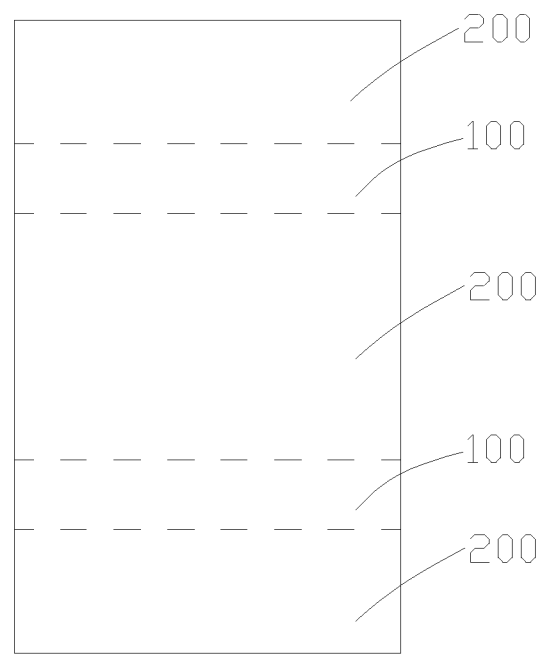

Based on the above reasons, embodiments of the present disclosure provide a flexible panel, as shown in FIGS. 1-3, the flexible panel comprises a folding region 100 and a non-folding region 200 outside the folding region 100 in a first direction.

The first direction is related to the folding manner of the flexible panel, for example, in FIG. 1, the flexible panel is in a rectangular shape, the flexible panel is folded in a length direction, so the first direction is the length direction of the flexible panel; in FIG. 2, the flexible panel is in a rectangular shape, the flexible panel is folded in a width direction, so the first direction is the width direction of the flexible panel.

The folding region 100 refers to the region that requires to be bent when the display panel is folded; and the non-folding region 200 refers to the region that does not bend or bends slightly when the display panel is folded. Numbers of the folding region 100 and the non-folding region 200 may be determined according to actual needs. As shown in FIG. 1 or FIG. 2, the flexible panel comprises a folding region 100 and two non-folding regions 200, the two non-folding regions 200 are respectively disposed on two outer sides of the folding region 100 in the first direction. Or, as shown in FIG. 3, the flexible panel comprises two folding regions 100 and three non-folding regions 200, a non-folding region 200 is disposed between two folding regions 100, and two other non-folding regions 200 are disposed on a side of one corresponding folding region 100 away from the central non-folding region 200, respectively. The numbers and the arrangements of the folding region 100 and the non-folding region 200 in the display panel are not limited to this.

In the embodiments of the present disclosure, the flexible panels in FIGS. 4 to 12 all adopt the division method of the folding region 100 and the non-folding region 200 shown in FIG. 1. Of course, in other embodiments, the folding region 100 and the non-folding region 200 in the flexible display panels in FIGS. 4 to 12 may adopt other forms (for example, FIG. 2 or FIG. 3) division methods of the folding region 100 and the non-folding region 200.c As shown in FIGS. 4-12, the flexible panel comprises a flexible display module 1, a first protecting layer 2 and a supporting plate 3 stacked in sequence. The flexible display module 1 and the supporting plate 3 are in connection with the first protecting layer 2. The supporting plate 3 comprises a first supporting portion 31 and the other supporting portion except the first supporting portion 31, the first supporting portion 31 of the supporting plate 3 is located in the folding region 100 and close to an outer edge of the flexible panel, a width of the first supporting portion 31 is less than a width of the other supporting portion except the first supporting portion 31 in the supporting plate 3.

Figure 4:
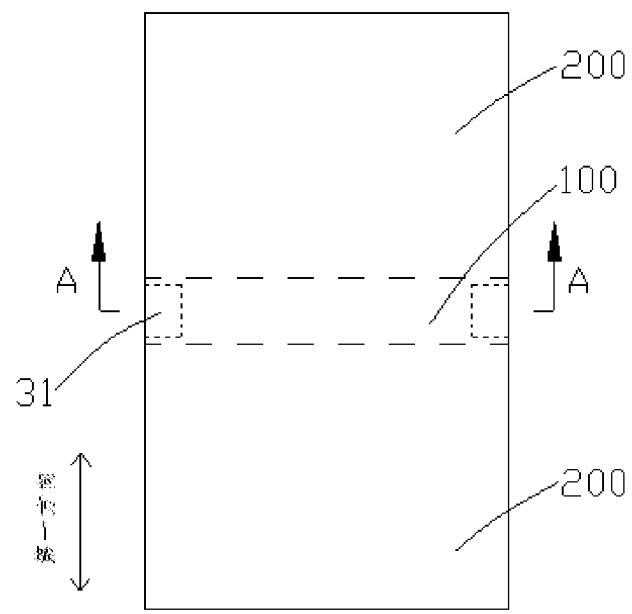
FIG. 4 is a structural schematic view of a flexible display panel according to an embodiment of the present disclosure.
Figure 8:
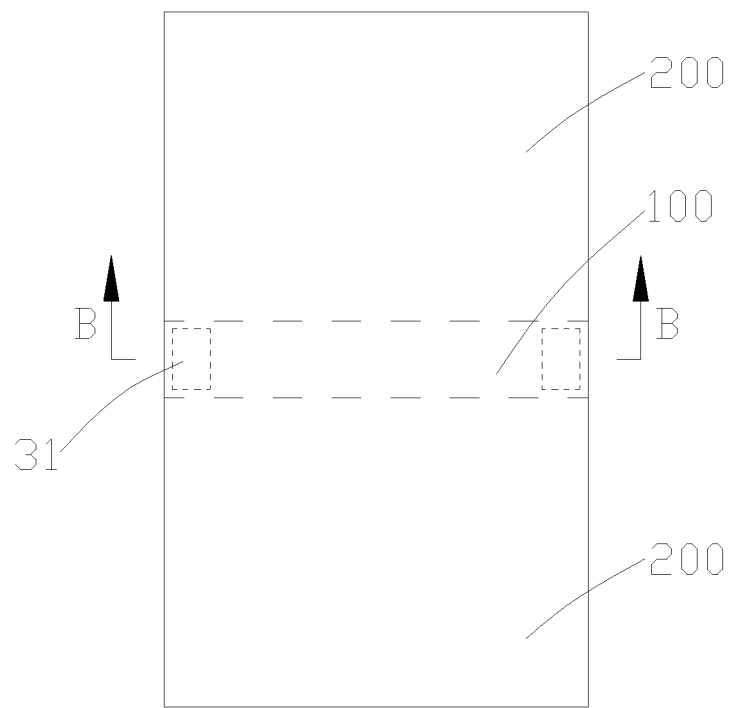
FIG. 8 is a structural schematic view of a flexible display panel according to another embodiment of the present disclosure.
Figure 10:
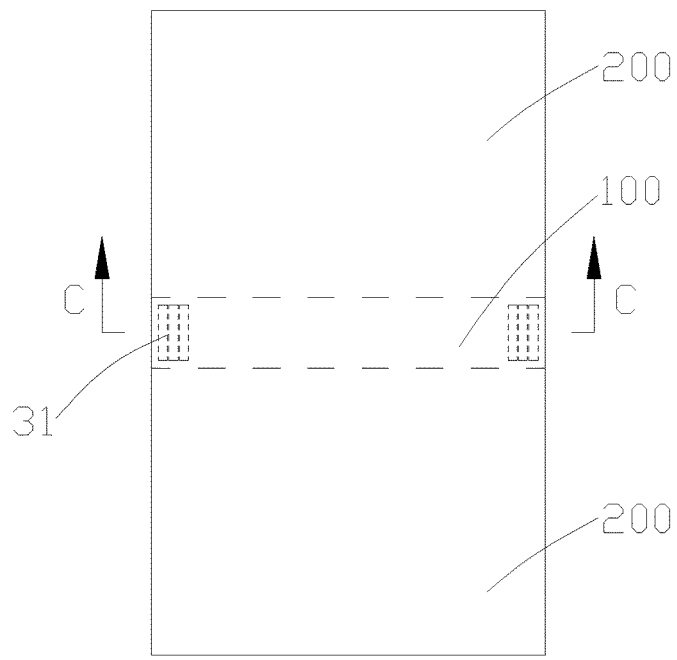
FIG. 10 is a structural schematic view of a flexible display panel according to still another embodiment of the present disclosure.

It should be noted that, in FIGS. 4, 8 and 10, the first supporting portion 31 cannot be seen under actual conditions, for the clarity of understanding of the position of the first supporting portion 31 in the flexible panel, dotted boxes are particularly used to approximately express features of the first supporting portion 31 in the drawings.

It should be noted that, in the embodiments of the present disclosure, the term "outer edge" is defined as the peripheral edge of a plate/layer. Here, the outer edge of the flexible panel (or components thereof, for example, the flexible display module, the first protecting layer or the supporting plate) is the peripheral edge of the flexible panel, a surface where the outer edge of the flexible panel (or components thereof, for example, the flexible display modulus, the first protecting layer or the supporting plate) is located is defined as the side surface, and a surface of the flexible panel (or components thereof, for example, the flexible display modulus, the first protecting layer or the supporting plate) perpendicular to the side surface is defined as the top surface or the bottom surface. For example, as shown in FIGS. 5 to 6, 7, 9 and 11, a surface indicated by the reference number 32 is the first side surface of the support plate 31, and a surface of the supporting plate 31 perpendicular to the first side surface 32 is a top surface or a bottom surface of the supporting plate 31.

Those skilled in the art would understand that, for the same supporting plate 3, the elastic modulus of the supporting plate 3 is associated with the thickness, the greater the thickness of the supporting plate 3 is, the larger the elastic modulus would be; the smaller the thickness of the supporting plate 3 is, the less the elastic modulus would be.

In the related art, in the first protecting layer 2 and the encapsulating layer 5 of the flexible display module 1, a portion which is located in the folding region 100 and is close to the outer edge of the flexible panel are prone to damages during being folded. In the flexible panel provided in the embodiments of the present disclosure, as the thickness of the first supporting portion 31 is relatively small, the elastic modulus of the first supporting portion 31 is less than the elastic modulus of the other supporting portion. The flexible panel is applied to a display device, portions prone to damages in the first protecting layer 2 and the encapsulating layer 5 are facing the first supporting portion 31 of the supporting plate 3. Compared with the related art, when the first protecting layer 2 and the encapsulating layer 5 of the embodiments of the present disclosure are bent, forces on the portions prone to damages are significantly reduced, risks of damages to the first protecting layer 2 and the encapsulating layer 5 are effectively reduced, so that the display device is capable of withstanding more times of folding, and the service life of the display device is increased.

Besides, the first supporting portion 31 is merely a small area of the supporting plate 3, and reducing the thickness of the small area of the supporting plate 3 will not affect the recovery of the supporting plate 3 significantly. The supporting plate 3 may still provide a strong recovery for the display device, reducing the risk of creases on the display device.

In the flexible panel provided in some embodiments of the present disclosure, as shown in FIGS. 4, 8 and 10, the supporting plate 3 comprises two first side surfaces 32 parallel to the first direction, the two first side surfaces 32 are located on two opposite sides of the supporting plate 3, respectively. In the portion of the supporting plate 3 in the folding region 100, regions close to the two first side surfaces 32 are provided with at least one recess 33 or 34, respectively. The first supporting portion 31 is a portion of the supporting plate 3 facing the recess 33 or 34 in the thickness direction.

Taking FIG. 4 as an example, the first direction is the length direction of the supporting plate 3, the first side surface 32 is the side surface in the length direction of the supporting plate 3, the top surface of the supporting plate 3 faces the bottom surface of the flexible display module 1, two first side surfaces 32 are located on two opposite sides of the supporting plate 3 respectively, and the first side surfaces 32 are the outer edges of the flexible panel.

In the region of the supporting plate 3 close to each first side surface 32, the number, the length and the width of the recess 33 are not specifically limited, and may be determined according to actual needs.

The recess 33 or 34 may be formed in the forming process of the supporting plate 3, for example, for the supporting plate 3 formed by an injection molding process, a male mold part for forming the recess 33 or 34 may be provided in the injection mold, the first supporting portion 31 faces the portion of the male mold part; or, 3D printing technology is used to produce the supporting plate with the recess 33 or 34. The recess 33 or 34 may also be formed after removing a part of the materials in the predetermined region of the supporting plate 3 by processes of milling, turning or laser, etc., the first supporting portion 31 is the remaining part in the predetermined region.

In the flexible panel provided in some embodiments of the present disclosure, the thickness of the first supporting portion 31 is ⅓ to ½ of the thickness of the other supporting portion of the supporting plate 3 except the first supporting portion 31.

The other supporting portion of the supporting plate 3 except the first supporting portion 31 can be regarded as a plate with uniform thickness, and the thickness of the other supporting portion is H. For the first supporting portion 31, the thicknesses of various positions thereof may be the same or may be inconsistent, but thicknesses of various positions of the first supporting portion 31 should fall within ⅓ to ½ of the H value.

As shown in the embodiment in FIG. 4, the recess 33 is disposed on the bottom surface of the supporting plate 3 away from the flexible display module 1, while the opening of the recess 33 faces away from the flexible display module 1. Or, in some embodiments not shown, the recess is disposed on the top surface of the supporting plate close to the flexible display module, while the opening of the recess faces the flexible display module.

In the display panel provided in some embodiments of the present disclosure, as shown in FIGS. 4-7, the recess is the first recess 33 specifically, the first recess 33 is provided with a first opening 331 and a second opening 332. The first opening 331 is disposed on the bottom surface (in some embodiments may be the top surface) of the supporting plate 3, and the second opening 332 is disposed on the first side surface 32 of the supporting plate 3.

Figure 5:
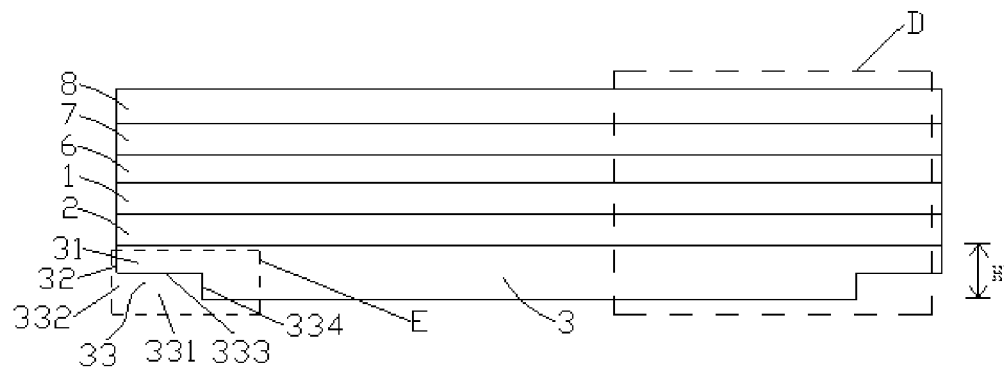
FIG. 5 is a form of a sectional view of FIG. 4 taken along line AA.
Figure 6:
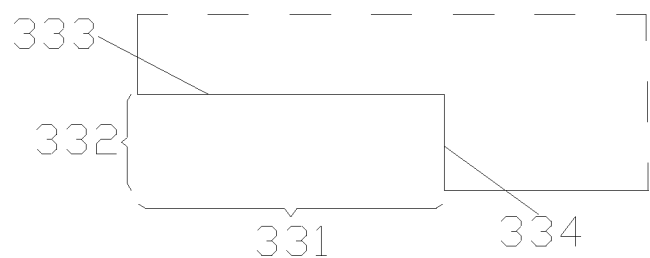
FIG. 6 is a partial enlarged view of E in FIG. 5.

In the embodiments of the present disclosure, the first recess 33 refers to the recess 33 with two openings. Taking FIGS. 5 and 7 as examples, the first recess 33 is disposed on the bottom surface of the supporting plate 3 away from the flexible display module 1, the first recess 33 can be regarded as being formed after a cuboid is removed from the supporting plate 3, two side surface of the cuboid belongs to the top surface and the first side surface 32 of the supporting plate 3, thereby the first opening 331 and the second opening 332 are formed. In FIG. 6, the first opening 331 is a region defined by a bracket facing towards the right side, the second opening 332 is a region defined by a bracket facing towards the upper side. It should be noted that, for the purpose of clarity, only the structure of the recess located on one side surface (on the left side in the drawings) is denoted.

In the flexible panel provided in some embodiments of the present disclosure, the first recess 33 comprises a first recess bottom surface 333 facing towards the first opening 331, and a second recess bottom surface 334 facing towards the second opening 332. Those skilled in the art may understand that, taking FIG. 5 as an example, the first recess bottom surface 333 is a surface of the first recess 33 seen from a direction perpendicular to the bottom of the supporting plate 3, the second recess bottom surface 334 is a surface of the first recess 33 seen from a direction perpendicular to the first side surface 32 of the supporting plate 3.

In some embodiments, the first recess bottom surface 333 and the second recess bottom surface are both planar surfaces. As shown in FIG. 5, the first recess bottom surface 333 is parallel to the bottom surface of the supporting plate 3, the second recess bottom surface 334 is parallel to the first side surface 32, and the first recess bottom surface 333 and the second recess bottom surface 334 are perpendicular to each other. Of course, the first recess bottom surface 333 and the second recess bottom surface 334 may also form an acute angle or an obtuse angle. Since the planar surface is easier for processing, for the first recess 33 formed by removing materials, the first recess bottom surface 333 and the second recess bottom surface 334 are both designed to be planar surfaces, which may reduce the processing difficulties.

Figure 7:
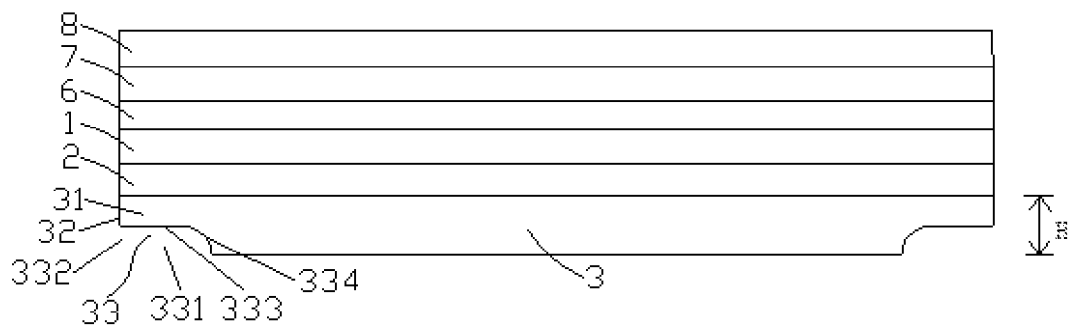
FIG. 7 is another form of the sectional view of FIG. 4 taken along line AA.

In some embodiments, the first recess bottom surface 333 is a planar surface, and the second recess bottom surface 334 is an arc-shaped surface. As shown in FIG. 7, the first recess bottom surface 333 and the second recess bottom surface 334 may be connected smoothly, the arc-shaped second recess bottom surface 334 may disperse the stress, avoiding the supporting plate 3 from breaking when it is folded.

Figure 9:
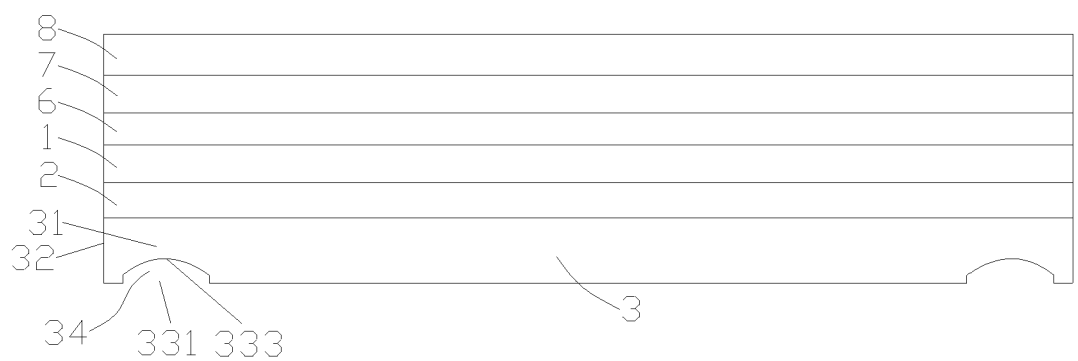
FIG. 9 is a sectional view of FIG. 8 taken along line BB.

In the flexible panel provided in some embodiments of the present disclosure, as shown in FIGS. 8 and 9, the recess is the second recess 34 specifically, the second recess 34 is provided with a first opening 331. The first opening 331 is disposed on the bottom surface or the top surface of the supporting plate 3. The second recess 34 comprises a first recess bottom surface 333 facing towards the first opening 331, the first recess bottom surface 333 is an arc-shaped surface or a planar surface.

In the embodiments of the present disclosure, the second recess 34 refers to a recess with only one opening. Taking FIG. 9 as an example, the second recess 34 is provided on the bottom surface of the supporting plate 3 away from the flexible display module 1, the second recess 34 faces away from the flexible display module 1. Those skilled in the art may understand that, the first recess bottom surface 333 of the second recess 334 is a surface of the second recess 34 seen from a direction perpendicular to the bottom surface of the supporting plate 3, the first recess bottom surface 333 may be an arc-shaped surface or a planar surface.

Figure 11:
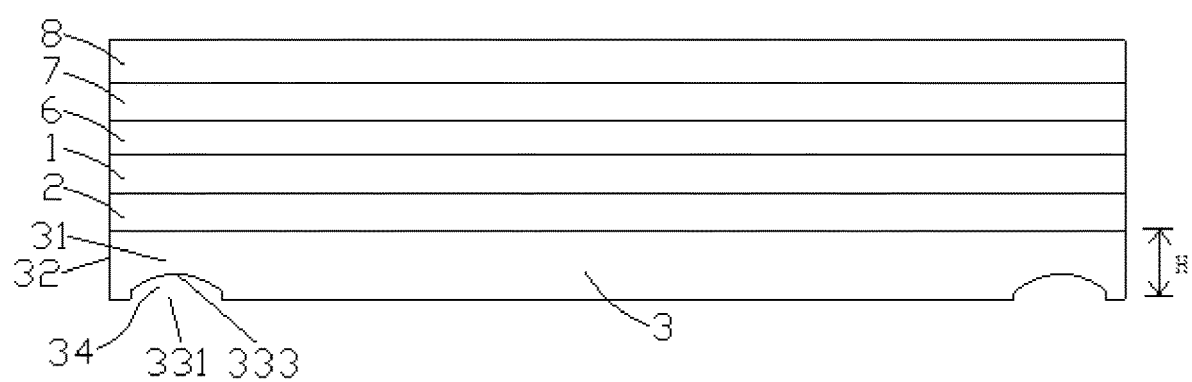
FIG. 11 is a sectional view of FIG. 10 taken along line CC.

In some embodiments, as shown in FIGS. 10 and 11, a plurality of second recesses 34 are disposed in the region of the first supporting portion 31 close to the first side surface 32, the plurality of recesses 34 are arranged at intervals in a direction perpendicular to the first side surface 32.

In the region close to each first side surface 32, the number of the second recesses 34 is not specifically limited, which may be determined according to actual needs. The region close to each first side surface 32 is provided with three second recesses 34, the three second recesses 34 are arranged at intervals in the direction perpendicular to the first side surface 32, the length direction of the second recesses 34 is parallel to the length direction of the supporting plate 3, and the first recess bottom surface 333 of the second recess 34 is an arc-shaped surface.

Figure 12:
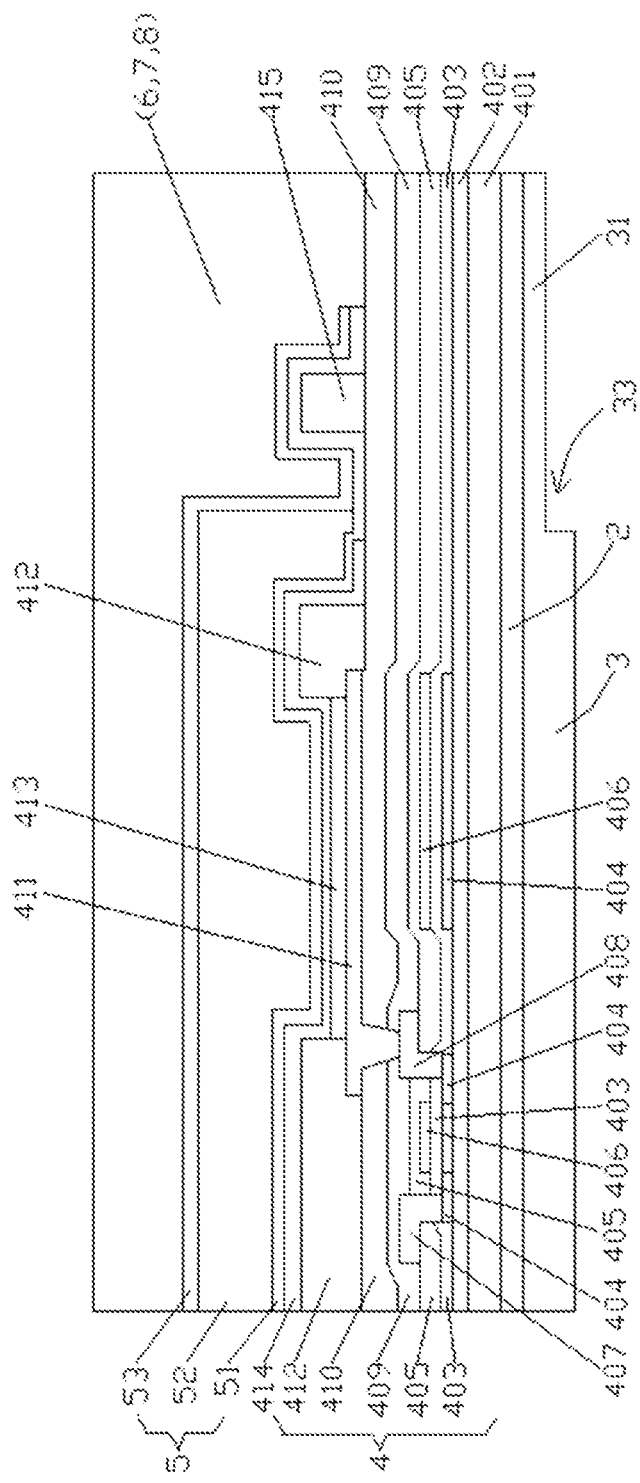
FIG. 12 is a partial enlarged view of D in FIG. 5.

In the embodiments of the present disclosure, FIG. 12 is a partial enlarged view of D in FIG. 5. FIG. 12 further illustrates the specific structure of the flexible display module 1. In the flexible panel provided in some embodiments of the present disclosure, taking FIGS. 5 and 12 as examples. The flexible display module 1 comprises a display functional layer 4 and an encapsulating layer 5, the encapsulating layer 5 and the supporting plate 3 are disposed on two sides of the display functional layer 4, respectively. The encapsulating layer 5 comprises a first inorganic encapsulating film 51, an organic encapsulating film 52 and a second inorganic encapsulating film 53 stacked in sequence in the direction away from the display functional layer 4. The recess 33 at least partly extends beyond the organic encapsulating film 52 in a direction perpendicular to the first side surface 32.

As shown in FIG. 12, the first protecting layer 2 and the supporting layer 3 are located under the display functional layer 4, the encapsulating layer 5 is located on the display functional layer 4, most of the first recess 33 extends beyond the organic encapsulating film 52 in the direction perpendicular to the first side surface 32.

The first inorganic encapsulating film 51, the organic encapsulating film 52 and the second inorganic encapsulating film 53 are formed by deposition in sequence, the first inorganic encapsulating film 51 and the second inorganic encapsulating film 53 may prevent oxygen and moisture from permeating into the display functional layer 4, the organic encapsulating film 52 may absorb the stress acting on the first inorganic encapsulating film 51 and the second inorganic encapsulating film 53 to increase the flexibility.

In some embodiments, a thin film field effect transistor in the display functional layer 4 may adopt a top gate structure or a bottom gate structure. Specifically, as shown in FIG. 12, the display functional layer 4 comprises a flexible substrate 401, a barrier buffer layer 402, a gate insulating layer 403, an active layer 404, an interlayer insulating layer 405, a gate layer 406, a source connecting layer 407, a drain connecting layer 408, a passivation layer 409, a planarization layer 410, an anode layer 411, a pixel define layer 412, an organic light emitting layer 413, a cathode layer 414 and a blocking layer 415.

The flexible substrate 401 is located on the first protecting layer 2, the barrier buffer layer 402 is located on the flexible substrate. the active layer 404 is disposed in a predetermined region on the top surface of the barrier buffer layer 402, the surroundings of the active layer 404 and a partial area of the top surface of the active layer 404 are covered with the gate insulating layer 403. is provided with the gate layer 406 is disposed in a predetermined region on the top surface of the gate insulating layer 403, the interlayer insulating layer 405 covers the gate insulating layer 403 and the gate layer 406. A part of the source connecting layer 407 and the drain connecting layer 408 is disposed on the top surface of the interlayer insulating layer 405, another part thereof penetrates the interlayer insulating layer 405 and the gate insulating layer 403, and contacts with the corresponding active layer 404, respectively. The passivation layer 409 covers the interlayer insulating layer 405, the source connecting layer 407 and the drain connecting layer 408, the planarization layer 410 is disposed on the top surface of the passivation layer 409. A part of the anode layer 411 is disposed on the top surface of the passivation layer 409, another part thereof penetrates the planarization layer 410 and the passivation layer 409 to contact with the drain connecting layer 408. The organic light emitting layer 413 is disposed on a predetermined region on the top surface of the anode layer 411, a part of the pixel define layer 412 is located around the anode layer 411, and covers the region on the top surface of the anode layer 411 where the organic light emitting layer 413 is not disposed; another part of the pixel define layer 412 is disposed on the planarization layer 410. The cathode layer 414 covers the pixel define layer 412 and the organic light emitting layer 413, the first inorganic encapsulating film 51 covers the cathode layer 414. The blocking layer 415 is located outside the first inorganic encapsulating film 51, and is disposed in a predetermined region on the top surface of the planarization layer 410.

In some embodiments, as shown in FIG. 5, the flexible panel provided in the embodiments of the present disclosure further comprises: a polarizer layer 6, a touching functional layer 7 and a second protecting layer 8. The polarizer layer 6, the touching functional layer 7 and the second protecting layer 8 are located on a side of the flexible display module 1 away from the supporting plate 3. The polarizer layer 6, the touching functional layer 7 and the second protecting layer 8 are stacked in sequence in a direction away from the display functional layer 4.

FIG. 12 does not show details of the polarizer layer 6, the touching functional layer 7 and the second protecting layer 8, it can be known by incorporating FIGS. 5 and 12 that the polarizer layer 6 is actually located on the second inorganic encapsulating film 53, the touching functional layer 7 is located on the polarizer layer 6, the second protecting layer 8 is located on the touch functional layer 7 in sequence.

Based on the same inventive concept, the embodiments of the present disclosure further provide a display device, comprising the flexible panel according to any of the aforementioned embodiments of the present disclosure.

In the flexible panel provided by the embodiments of the present disclosure, since the thickness of the first supporting portion is relatively small, the elastic modulus of the first supporting portion is less than the elastic modulus of the other supporting portion. The flexible panel is applied to the display device, a portion of the first protecting layer and the encapsulating layer prone to damages is facing the first supporting portion of the supporting plate. Compared with the related art, when the first protecting layer and the encapsulating layer of the embodiments of the present disclosure are bent, forces acting on the portion prone to damages are reduced significantly, which effectively reduces the risk of damage to the first protecting layer and the encapsulating layer, so that the display device is capable of withstanding more times of folding, and the service life of the display device is increased.

Besides, the first supporting portion is only a small area of the supporting plate, reducing the thickness of the small area of the supporting plate will not affect the recovery of the supporting plate significantly. The supporting plate may still provide a strong recovery for the display device, which reduces the risk of creases on the display device.

In the description of the present disclosure, it should be understood that, orientation or position relationships indicated by terms "center", "upper", "lower", "front", "rear", "left", "right", "vertical", "horizontal", "top", "bottom", "inner", "outer" are orientation or position relationships based on the drawings, and are only used for the description of the present disclosure and the convenience of description, rather than indicate or imply that the indicated device or elements must have particular orientations, configured and operated in particular orientations, thus cannot be construed as limitations to the present disclosure.

Terms "first", "second" are only used for the purpose of description, and cannot be construed to indicate or imply the relative importance or implicitly specify the number of technical features indicated. Whereby, features defined with "first", "second" may comprise one or more said features clearly or implicitly. In the description of the present disclosure, unless otherwise specified, "a plurality of" means equal to or greater than two.

In the description of the present disclosure, unless otherwise specified and defined, terms "mount", "connect", "connection" should be understood broadly, for example, it may be a fixed connection, or may be a detachable connection, or being connected as a whole; the connection may be direct, may also be indirect via an intermediate medium, or may be a communication between inners of two elements. For those skilled in the art, the specific meanings of the terms in the present disclosure may be understood according to specific conditions.

In the description of the specification, specific features, structures, materials or characteristics may be combined in a suitable way in any one or more embodiments.

The above description is only a part of the embodiments of the present disclosure, it should be noted that, for those skilled in the art, various modifications and improvements may be made without departing from the principle of the present disclosure, these modifications and improvements should also be considered the protecting range of the present disclosure.

What is claimed is:

1. A flexible panel, the flexible panel is divided into a folding region and a non-folding region adjacent to the folding region in a first direction, the flexible panel comprises a flexible display module, a first protecting layer and a supporting plate stacked in sequence; the supporting plate is divided into a first supporting portion and an other supporting portion except the first supporting portion, the first supporting portion is located in the folding region and is close to an outer edge of the flexible panel, a width of the first supporting portion is less than a width of the other supporting portion; and the supporting plate comprises two first side surfaces parallel to the first direction, in a portion of the support plate located in the folding region, regions adjacent to the two first side surfaces are provided with at least one recess, respectively; the first supporting portion is a portion of the supporting plate facing the recess in a thickness direction; and a width of the first supporting portion is ⅓ to ½ of the width of the other supporting portion; the recess is disposed on a bottom surface of the supporting plate away from the flexible display module; and the recess comprises a first recess, the first recess is provided with a first opening and a second opening; the first opening is provided on the bottom surface of the supporting plate, the second opening is provided on the first side surface of the supporting plate; and the first recess comprises a first recess bottom surface facing the first opening, and a second recess bottom surface facing the second opening; the first recess bottom surface is a planar surface, and the second recess bottom surface is an arc-shaped surface.

2. The flexible panel according to claim 1, wherein the recess comprises a second recess, the second recess is provided with a first opening, the first opening is provided on the top surface or the bottom surface of the supporting plate; the second recess comprises a second recess bottom surface facing the first opening, the second recess bottom surface is an arc-shaped surface or a planar surface.

3. The flexible panel according to claim 2, wherein a plurality of second recesses are provided in a region of the first supporting plate close to the first side surface, the plurality of second recesses are arranged at intervals in a direction perpendicular to the first side surface.

4. The flexible panel according to claim 2, wherein the flexible display module comprises a display functional layer and an encapsulating layer, the encapsulating layer and the supporting plate are respectively disposed on both sides of the display functional layer, the encapsulating layer comprises a first inorganic encapsulating film, an organic encapsulating film and a second inorganic encapsulating film which are stacked in sequence in a direction away from the display functional layer; the recess at least extends beyond the organic encapsulating film in a direction perpendicular to the first side surface.

5. The flexible panel according to claim 4, further comprising: a polarizer layer, a touching functional layer and a second protecting layer;

wherein the first protecting layer is located between the flexible display module and the supporting plate; the polarizer layer, the touching functional layer and the second protecting layer are located on a side of the flexible display module away from the supporting plate; the polarizer layer, the touching functional layer and the second protecting layer are stacked in sequence in the direction away from the display functional layer.

6. A display device, comprising: the flexible panel according to claim 1.

* * * * *